(12) United States Patent
Takebayashi et al.

(10) Patent No.: US 12,087,613 B2
(45) Date of Patent: Sep. 10, 2024

(54) WAFER PLACEMENT TABLE AND METHOD OF MANUFACTURING THE SAME

(71) Applicant: NGK INSULATORS, LTD., Nagoya (JP)

(72) Inventors: Hiroshi Takebayashi, Handa (JP); Kenichiro Aikawa, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 381 days.

(21) Appl. No.: 17/643,600

(22) Filed: Dec. 10, 2021

(65) Prior Publication Data
US 2022/0102186 A1    Mar. 31, 2022

Related U.S. Application Data

(63) Continuation of application No. PCT/JP2020/022830, filed on Jun. 10, 2020.

(30) Foreign Application Priority Data

Jun. 28, 2019    (JP) .................................. 2019-121487

(51) Int. Cl.
*B23Q 3/15*    (2006.01)
*C23C 4/02*    (2006.01)
(Continued)

(52) U.S. Cl.
CPC ............ *H01L 21/6875* (2013.01); *C23C 4/02* (2013.01); *C23C 4/134* (2016.01); *H01L 21/68757* (2013.01)

(58) Field of Classification Search
CPC ........ H01L 21/6875; B24B 1/00; B24B 3/065
See application file for complete search history.

(56) References Cited

U.S. PATENT DOCUMENTS

| | | | |
|---|---|---|---|
| 7,040,963 B1 * | 5/2006 | Okuda | B24B 37/16 451/28 |
| 7,070,480 B2 * | 7/2006 | Moon | B24B 37/26 451/36 |

(Continued)

FOREIGN PATENT DOCUMENTS

| | | |
|---|---|---|
| JP | 2005-033221 A | 2/2005 |
| JP | 2006-147724 A | 6/2006 |

(Continued)

OTHER PUBLICATIONS

English translation of the International Preliminary Report on Patentability (Chapter I) dated Jan. 6, 2022 (Application No. PCT/JP2020/022830)

(Continued)

*Primary Examiner* — Lee D Wilson
(74) *Attorney, Agent, or Firm* — BURR PATENT LAW, PLLC

(57) ABSTRACT

A wafer placement table is a ceramic sintered body with a surface provided with multiple projections that support a wafer. Of the surface of the ceramic sintered body, the area provided with no projection is a mirror surface which has a surface roughness Ra of 0.1 μm or less. The projections are formed of an aerosol deposition film or a thermal spray film made of the same material as for the ceramic sintered body.

3 Claims, 2 Drawing Sheets

(51) Int. Cl.
*C23C 4/134* (2016.01)
*H01L 21/687* (2006.01)

(56) References Cited

U.S. PATENT DOCUMENTS

| | | | | |
|---|---|---|---|---|
| 8,062,098 | B2* | 11/2011 | Duescher | B24B 37/14 |
| | | | | 451/550 |
| 2005/0118939 | A1* | 6/2005 | Duescher | B24D 11/001 |
| | | | | 451/527 |
| 2005/0120962 | A1 | 6/2005 | Ushioda et al. | |
| 2010/0273402 | A1* | 10/2010 | Shimizu | B24B 53/017 |
| | | | | 451/443 |
| 2013/0201598 | A1* | 8/2013 | Ishikawa | H02N 13/00 |
| | | | | 216/13 |
| 2017/0140970 | A1 | 5/2017 | Boyd, Jr. et al. | |
| 2020/0286767 | A1* | 9/2020 | Shiraishi | C23C 16/4581 |
| 2020/0303229 | A1* | 9/2020 | Ozaki | H01L 21/67098 |
| 2022/0102186 | A1* | 3/2022 | Takebayashi | C23C 4/134 |

FOREIGN PATENT DOCUMENTS

| | | |
|---|---|---|
| JP | 2011-100844 A | 5/2011 |
| JP | 2015-023168 | 2/2015 |
| JP | 2018-536287 A | 12/2018 |
| KR | 10-2016-0037670 A | 4/2016 |
| KR | 10-2017-0044396 A | 4/2017 |

OTHER PUBLICATIONS

International Search Report and Written Opinion (Application No. PCT/JP2020/022830) dated Sep. 15, 2020 (with English translation)
Korean Office Action (Application No. 10-2021-7040469) dated Sep. 9, 2023 (with English translation) (10 pages).

* cited by examiner

WAFER PLACEMENT TABLE AND METHOD OF MANUFACTURING THE SAME

BACKGROUND OF THE INVENTION

1. Field of the Invention

The present invention relates to a wafer placement table and a method of manufacturing the wafer placement table.

2. Description of the Related Art

A wafer placement table, on which a wafer is placed, has been conventionally used in transfer, exposure, a film deposition process such as CVD, washing, etching, and microfabrication such as dicing, for a semiconductor wafer. PTL 1 discloses such a wafer placement table including: a ceramic sintered body in which projections and depressions are formed by erosion processing (blast processing) on the upper surface; an electrostatic electrode embedded in the ceramic sintered body; and a terminal that connects the electrostatic electrode to an external power supply.

CITATION LIST

Patent Literature

PTL 1: Japanese Unexamined Patent Application Publication No. 2006-147724

SUMMARY OF THE INVENTION

It is common that when erosion processing is applied to the upper surface of a ceramic sintered body, the upper surface of the ceramic sintered body is mirror-finished, an area where projections are desired to be formed is covered with a mask, and the other area not covered with the mask is smashed by erosion processing (see FIG. 2).

However, when erosion processed area of the upper surface of the ceramic sintered body is microscopically observed, an area where particles are going to fall and/or an area where residues of media for the erosion processing are left may be seen. If such an area exists, there is a possibility that the area may cause generation of undesired particles in a semiconductor process. In order to improve this point, surface-treatment (for example, polishing) may be performed on the erosion processed area using a soft material, for example. However, the surface after being polished is rougher than the mirror surface, thus there is still a possibility that generation of particles may be caused.

The present invention has been devised to solve such a problem, and it is a main object to prevent generation of particles in a semiconductor process.

A wafer placement table of the present invention is a ceramic sintered body with a surface provided with multiple projections that support a wafer, wherein of the surface of the ceramic sintered body, an area provided with no projection is a mirror surface which has a surface roughness Ra of 0.1 μm or less, and the projections are formed of an aerosol deposition film or a thermal spray film made of the same material as for the ceramic sintered body.

The wafer placement table is obtained, for example, by mirror-finishing the surface of a ceramic sintered body, then forming an AD film or a thermal spray film on an area where projections are desired to be formed. Of the surface of the ceramic sintered body of the wafer placement table, the area provided with no projection is a mirror surface, which thus does not cause generation of particles. Consequently, with the wafer placement table, it is possible to prevent generation of particles in a semiconductor process.

In the wafer placement table of the present invention, edges (the boundary between the top surface and the side surface) of the projections may be rounded. In this manner, each edge of the projections is unlikely to be a stress concentration point of mechanical external forces.

In the wafer placement table of the present invention, the projections may have a denseness lower than the denseness of the ceramic sintered body. The ceramic sintered body can be made denser by using hot press sintering or the like. However, the projections are formed of an AD film or a thermal spray film, thus have a denseness lower than the denseness of the ceramic sintered body.

A method of manufacturing a wafer placement table of the present invention includes: (a) step of mirror-finishing a surface of a ceramic sintered body; and (b) step of forming projections by an aerosol deposition method or a thermal spray method on a section of the surface, on which the projections are desired to be formed.

According to the method of manufacturing a wafer placement table, the wafer placement table of the present invention described above can be manufactured relatively easily.

DETAILED DESCRIPTION OF THE INVENTION

Figure 1:
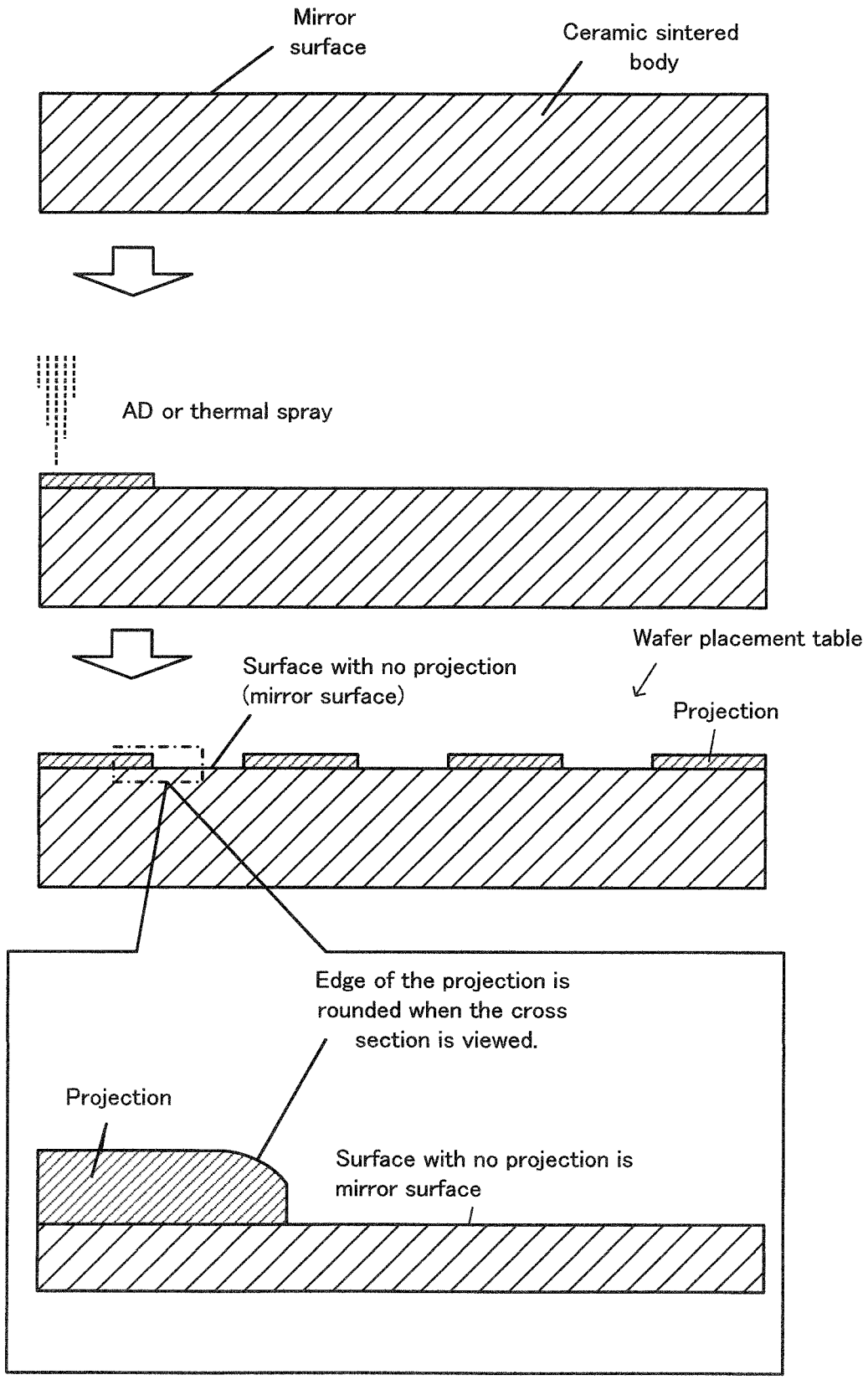
FIG. 1 is a view of manufacturing processes for a wafer placement table of the present embodiment.
Figure 2:
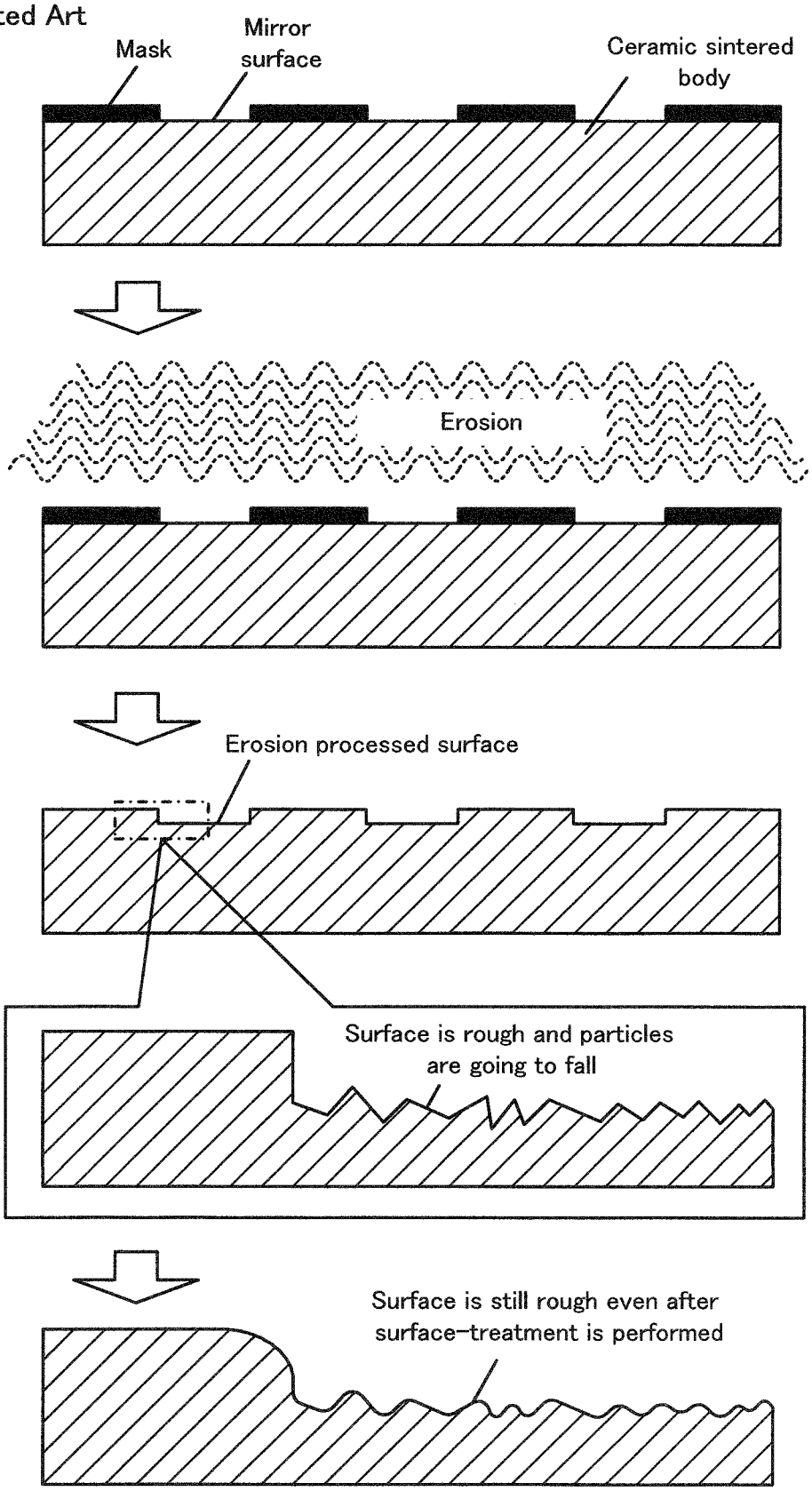
FIG. 2 is a view of manufacturing processes for a conventional wafer placement table.

A preferred embodiment of the present invention will be described below with reference to the drawings. FIG. 1 is a view (vertical cross-sectional view) of manufacturing processes for a wafer placement table of the present embodiment.

The wafer placement table is a disc-shaped ceramic sintered body with a surface provided with multiple projections that support a wafer. Of the surface of the ceramic sintered body, an area provided with no projection is a mirror surface which has a surface roughness Ra of 0.1 μm or less. The projections are formed of an AD film or a thermal spray film made of the same material as for the ceramic sintered body. The edges (the boundary between the top surface and the side surface) of the projections are rounded in a cross section. When the cross section of the wafer placement table is viewed, the projections have a denseness lower than the denseness of the ceramic sintered body. The ceramic sintered body has a dense characteristic by using hot press sintering. In contrast, the projections are formed of an AD film or a thermal spray film, thus have a denseness lower than the denseness of the ceramic sintered body (for example, the degree of porosity is increased). At least one of an electrostatic electrode, an RF electrode and a heater electrode (resistance heating element) may be embedded in the ceramic sintered body. The top surfaces of the projections may be polished.

A method of manufacturing a wafer placement table includes: (a) step of mirror-finishing the surface of a ceramic sintered body; and (b) step of forming projections by an AD method (including a plasma AD method) or a thermal spray method on a section of the surface, on which projections are desired to be formed. In step (b), the surface is covered with a mask so that only the section of the surface, on which projections are desired to be formed, is exposed, and projections may be formed on the exposed section by an AD method or a thermal spray method. The AD method allows a film of ceramic particles to be formed by an impact consolidation phenomenon, thus it is not necessary to sinter ceramic particles at a high temperature. It is more preferable to form the projections with an AD film than with a thermal spray film by taking into consideration that when a wafer is placed on the top surfaces of multiple projections, the projection and the wafer rub against each other, and when a semiconductor process is performed, particles may fall from the projections due to exposure to plasma. This is because the AD film is relatively dense and has a high adhesive property with the surface. When the projections are formed by a thermal spray method, in order to improve the adhesive property, it is preferable to rough the section on which projections are desired to be formed.

With the wafer placement table of the present embodiment described above, of the surface of the ceramic sintered body, the area provided with no projection is a mirror surface, which thus does not cause generation of particles. Consequently, with the wafer placement table, it is possible to prevent generation of particles in a semiconductor process.

In addition, each edge of the projections are rounded, thus unlikely to be a stress concentration point of mechanical external forces.

The present invention is not limited to the above-described embodiment, and can be carried out by various modes as long as they belong to the technical scope of the invention.

The present application claims priority from Japanese Patent Application No. 2019-121487 filed Jun. 28, 2019, the entire contents of which are incorporated herein by reference.

What is claimed is:

1. A wafer placement table which is a ceramic sintered body with a surface provided with multiple projections that support a wafer,
    wherein of the surface of the ceramic sintered body, an area provided with no projection is a mirror surface which has a surface roughness Ra of 0.1 µm or less, and
    the projections are formed of an aerosol deposition film or a thermal spray film made of the same material as for the ceramic sintered body, and
    wherein the projections have a denseness lower than a denseness of the ceramic sintered body.

2. The wafer placement table according to claim 1, wherein edges of the projections are rounded.

3. A method of manufacturing a wafer placement table, the method comprising:
    (a) step of mirror-finishing a surface of a ceramic sintered body; and
    (b) step of forming projections by an aerosol deposition method or a thermal spray method on a section of the surface, on which the projections are desired to be formed, and
    wherein the projections have a denseness lower than a denseness of the ceramic sintered body.

* * * * *